(12) United States Patent     (10) Patent No.: US 8,450,599 B2
Buchine et al.     (45) Date of Patent: May 28, 2013

(54) NANOSTRUCTURED DEVICES

(75) Inventors: Brent A. Buchine, Watertown, MA (US); Faris Modawar, Georgetown, TX (US); Marcie R. Black, Lincoln, MA (US)

(73) Assignee: Bandgap Engineering, Inc., Woburn, MA (US)

( * ) Notice: Subject to any disclaimer, the term of this patent is extended or adjusted under 35 U.S.C. 154(b) by 388 days.

(21) Appl. No.: 12/619,092

(22) Filed: Nov. 16, 2009

(65) Prior Publication Data

US 2010/0122725 A1    May 20, 2010

Related U.S. Application Data

(60) Provisional application No. 61/114,896, filed on Nov. 14, 2008, provisional application No. 61/157,386, filed on Mar. 4, 2009, provisional application No. 61/250,418, filed on Oct. 9, 2009.

(51) Int. Cl.
    *H01L 31/00*     (2006.01)
    *H01L 21/00*     (2006.01)

(52) U.S. Cl.
    USPC ............. 136/255; 136/256; 136/261; 438/57; 977/948

(58) Field of Classification Search
    USPC ............. 136/255, 261, 256; 977/948; 438/57
    See application file for complete search history.

(56) References Cited

U.S. PATENT DOCUMENTS

| | | | |
|---|---|---|---|
| 5,178,685 A * | 1/1993 | Borenstein et al. | 136/244 |
| 6,649,824 B1 * | 11/2003 | Den et al. | 136/256 |
| 2006/0207647 A1 * | 9/2006 | Tsakalakos et al. | 136/256 |
| 2007/0107103 A1 | 5/2007 | Kempa et al. | |
| 2007/0278476 A1 | 12/2007 | Black | |
| 2007/0289623 A1 | 12/2007 | Atwater | |
| 2008/0006319 A1 * | 1/2008 | Bettge et al. | 136/244 |
| 2008/0169017 A1 * | 7/2008 | Korevaar et al. | 136/249 |

FOREIGN PATENT DOCUMENTS

| | | |
|---|---|---|
| CN | 1693191 | 11/2005 |
| JP | 2005-059125 A | 3/2005 |
| KR | 10-0809248 B1 | 2/2008 |
| WO | WO-2010/056352 | 5/2010 |

OTHER PUBLICATIONS

Erik C. Garnett, Peidong Yang, J. Am. Chem. Soc. 130 (29) (2008) 9224-9225.
Brendan M. Kayes, Harry A. Atwater, Nathan S. Lewis, J. of App. Phy. 97 (11) 2005, 114302.

(Continued)

*Primary Examiner* — Jonathan Johnson
*Assistant Examiner* — Allison Bourke
(74) *Attorney, Agent, or Firm* — Wilmer Cutler Pickering Hale and Dorr LLP (57) ABSTRACT

A photovoltaic device is provided. It comprises at least two electrical contacts, p type dopants and n type dopants. It also comprises a bulk region and nanowires in an aligned array which contact the bulk region. All nanowires in the array have one predominant type of dopant, n or p, and at least a portion of the bulk region also comprises that predominant type of dopant. The portion of the bulk region comprising the predominant type of dopant typically contacts the nanowire array. The photovoltaic devices' p-n junction would then be found in the bulk region. The photovoltaic devices would commonly comprise silicon.

28 Claims, 5 Drawing Sheets

OTHER PUBLICATIONS

G. Goncher, R. Solanki, J.R. Carruthers, J. Conley Jr., Y. Ono, J. Electr. Mat. 35 (7) (2006) 1509-1512.

T. Heidel, J. Mapel, M. Singh, K. Celebi, M. Baldo, Apl 91 093506 (2007).

M. Kirkengen, J. Bergli, Y. Galperin, J. Appl. Phys. 102 (9) (2007) 093713.

C. Hagglund, M. Zach, B. Kasemo, Apl 92 (1) 013113 (2008).

U.S. Appl. No. 61/195,872, Oct. 9, 2008, Buchine et al.

U.S. Appl. No. 61/114,896, Nov. 14, 2008, Buchine et al.

U.S. Appl. No. 61/141,082, Dec. 29, 2008, Buchine et al.

U.S. Appl. No. 61/142,608, Jan. 5, 2009, Buchine et al.

S. Koynov, M.S. Brandt, M. Stutzman, "Black nonreflecting silicon surfaces for solar cells," Applied Physics Letters, 88, 203107 (2006).

K. Peng, Y. Xu, Y. Wu, Y. Yan, S. Lee, J. Zhu, "Aligned Single-Crystalline Si Nanowire Arrays for Photovoltaic Applications," Small, 2005 1 (11), 1062-1067.

Black et al., "Optical Properties of Bismuth Nanowires," Encyclopedia of Nanoscience and Nanotechnology, 2011, vol. 10, pp. 225-242.

Franssila, "Introduction to Microfabrication," 2004, John Wiley & Sons Ltd., ISBN 978-0-470-85105-0, 391 pages.

Gray, "Chapter 3. The Physics of the Solar Cell," Handbook of Photovoltaic Science and Engineering, 2003, pp. 61-112.

Green, "Chapter 10. Silicon Solar Cells, Advanced Principles & Practice," Centre for Photovoltaic Devices and Systems, Mar. 1995, ISBN 0733409946, 35 pages.

Kuiqing Peng et al., "Fabrication of Single-Crystalline Silicon Nanowires by Scratching a Silicon Surface with Catalytic Metal Particles," Advanced Functional Materials, 2006, 16, pp. 387-394.

Olson et al., "Chapter 9. High-Efficiency III-V Multijunction Solar Cells," Handbook of Photovoltaic Science and Engineering, 2003, pp. 359-411.

* cited by examiner

NANOSTRUCTURED DEVICES

CROSS-REFERENCE TO RELATED APPLICATIONS

This application claims priority to U.S. Provisional Patent Applications Nos. 61/114,896, filed Nov. 14, 2008, 61/157,386, filed Mar. 4, 2009, and 61/250,418 filed Oct. 9, 2009. These applications are incorporated by reference in their entireties.

BACKGROUND OF THE INVENTION

Photovoltaic cells are a major technology for generating electricity which is being deployed ever more widely. Improvements in the efficiency and cost of such cells are important.

In photovoltaic cells, light is absorbed in a semiconductor, which creates electron-hole pairs. Electrons then travel to one contact while holes travel to the opposite contact, thus producing electric current. The creation of electrons and holes via a photon-induced electronic interband transition is a necessary, but not sufficient, condition for practical electricity production. It is also in practice necessary that the optical absorption resulting from electronic excitation be the dominant absorption mechanism, otherwise the efficiency will be below acceptable levels. Free carrier absorption is where the energy of incident light is absorbed by free carriers inside the material and results in the free carriers gaining momentum. Free carrier absorption competes with optical absorption resulting in electronic transitions. Thus for solar cell designs using highly doped silicon, free carrier absorption is a limiter to solar cell efficiencies, particularly in the infrared region of light. (See reference (1) below.)

A solar cell requires an internal bias. Usually this internal bias is created by a p-n junction, which is obtained by doping the material. However, doping the material increases the concentration of free carriers and thus increases free carrier absorption and shifts this absorption to higher energies. In addition, increasing the doping increases the bulk recombination rate thus decreasing the conversion efficiency. Reasonably high doping levels are needed to keep sheet resistance low. Therefore, solar cells are often designed to have a very shallow and highly doped emitter region so that the sheet resistance is low and the free carrier absorption and the average bulk recombination rates are small, but this approach limits the thickness of the depletion region and hence how much current light can create in the device.

Materials with dimensions smaller than the free carrier diffusion length (nanomaterials) have suppressed free carrier absorption. (See, e.g., reference (2) below.) In this respect nanomaterials would be ideal for solar cells. In addition, nanomaterials have increased absorption and low reflection, which is also ideal for solar cells. However, a solar cell needs a conductive path for the free carriers to travel to the junction. In nanoparticles, a type of nanomaterial with dimensions reduced in all three directions, carriers need to hop or tunnel from one particle to the next. Since hopping and tunneling are inefficient, a highly resistive processes, nanoparticles are non-ideal for solar applications. On the other hand, nanowires, where dimensions are reduced in only two directions, retain the advantage of suppressed free carrier absorption for light with an electric field perpendicular to the wire axis, while allowing low-resistance transport parallel to the wire axis.

Figure 1:
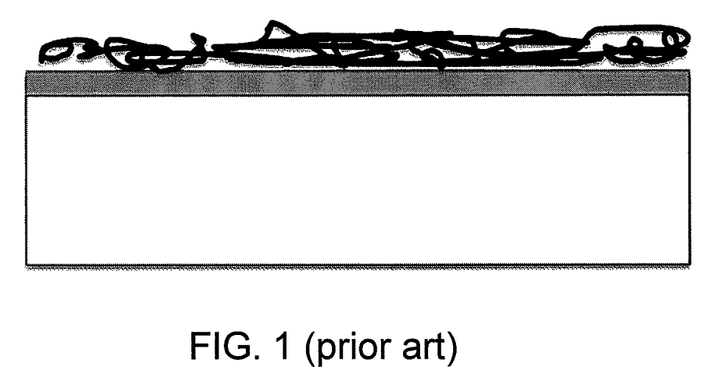
FIG. 1 (prior art) schematically depicts a solar cell with nanowires atop the cell (on the side which receives solar radiation).

Recently one group placed nanowires on top of a silicon solar cell, as depicted schematically in FIG. 1. In this design, the nanowires are not in electrical contact with the bulk silicon, not doped, and not aligned. The observed efficiency gain in these structures is possibly because the nanowires act like an anti-reflection coating for the bulk cell. Since the nanowires are not vertical to the substrate and not in electrical contact with the substrate, the maximum benefit from nanowires is not realized.

There have been proposals to use nanowires with concentric n and p regions. (See references (3), (4), and (5) below.) This device design is said to have unique advantages, including that the optical absorption length is decoupled from the free carrier diffusion length. However one deficiency of this design is that the junction area is very large and therefore leakage current will need to be controlled.

Others have proposed using silicon nanowires where one section of the wire is n type and the other section of the wire is p type. (See reference (6) below.) This design also has advantages, but as with the radial design, one possible limitation is the leakage current caused by surface states that run through the depletion region and junction.

Figure 2:
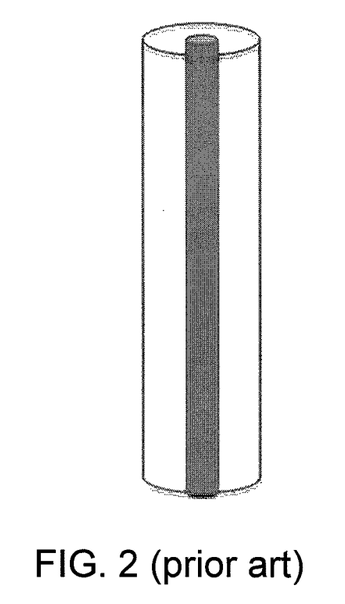
FIG. 2 (prior art) schematically depicts a solar cell with nanowires with concentric p and n regions.
Figure 3:
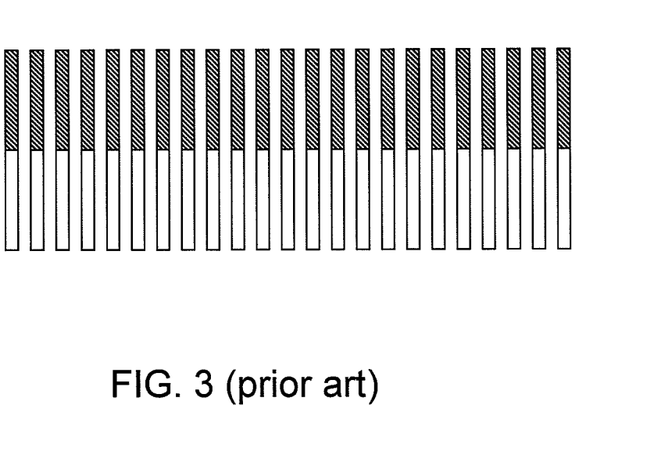
FIG. 3 (prior art) schematically depicts a solar cell with nanowires comprising both p and n regions.

Kayes, Atwater and Lewis (reference (7) below) performed calculations to better understand both radial (FIG. 2) and planar n-p junctions (FIG. 3) for photovoltaic applications. The calculations found that the quasi-neutral regions away from the depletion zone can tolerate more traps and larger recombination rate, which may be a result of fewer minority carriers in these regions to contribute to recombination. However, the calculations show that a low trap density is desirable in the depletion zone to achieve high efficiencies. Moreover, since nanowires have a large surface area, increased traps and recombination in the depletions zone may be expected.

Figure 4:
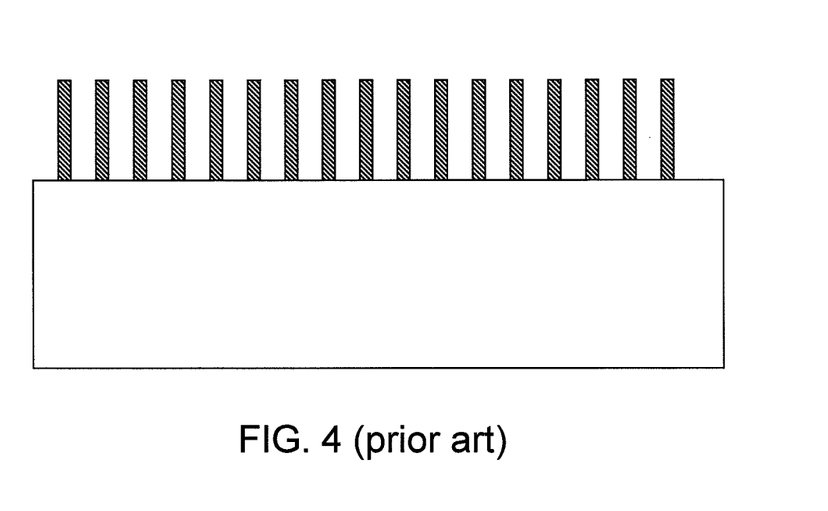
FIG. 4 (prior art) schematically depicts a solar cell with nanowires where the p-n junction lies at the contact of the nanowires and the bulk region.

Other groups have proposed photovoltaic devices where one material type (or doping) is made up of nanowires, and another material type (or doping) is made up of bulk material, as schematically depicted in FIG. 4. A junction is thus formed at the interface between the nanowires and the bulk material. Like the other designs, the nanowires are in the depletion region and at the junction, again yielding a device limited by surface recombination and carrier transport. (See references (8), (9), and (10) below.)

The designs described above reap some of the benefits of nanowire solar cells, but either do not take full advantage of these benefits or gain these at the expense of increased leakage current from nanowires in the depletion region.

There is therefore a continuing need for designs of nanowire solar cells which can achieve higher efficiency and lower cost.

SUMMARY OF THE INVENTION

In an aspect of this invention, a photovoltaic device is provided. It comprises at least two electrical contacts, p type dopants and n type dopants. It also comprises a bulk region and nanowires in an aligned array which contact the bulk region. All nanowires in the array have one predominant type of dopant, n or p, and at least a portion of the bulk region also comprises that predominant type of dopant. The portion of the bulk region comprising the predominant type of dopant typically contacts the nanowire array. The photovoltaic devices' p-n junction would then be found in the bulk region. The photovoltaic devices would commonly comprise silicon.

In an aspect of the invention, a device is provided comprising two or more contacts, a nanostructure partially covering a substrate, and a thin film covering portions of the substrate not covered by the nanostructure but within the nanostructure, wherein the thin film serves as a contact for the device.

DETAILED DESCRIPTION OF THE INVENTION

Before describing the present invention in detail, it is to be understood that this invention is not limited to specific reagents, materials, or device structures, as such may vary. It is also to be understood that the terminology used herein is for the purpose of describing particular embodiments only, and is not intended to be limiting.

Where a range of values is provided, it is intended that each intervening value between the upper and lower limit of that range and any other stated or intervening value in that stated range is encompassed within the disclosure. For example, if a range of 1 μm to 8 μm is stated, it is intended that 2 μm, 3 μm, 4 μm, 5 μm, 6 μm, and 7 μm are also disclosed, as well as the range of values greater than or equal to 1 μm and the range of values less than or equal to 8 μm.

A. General Description

In an aspect of this invention, a photovoltaic device is provided. It comprises at least two electrical contacts, p type dopants and n type dopants. It also comprises a bulk region and nanowires in an aligned array which contact the bulk region. All nanowires in the array have one predominant type of dopant, n or p, and at least a portion of the bulk region also comprises that predominant type of dopant. The portion of the bulk region comprising the predominant type of dopant typically contacts the nanowire array. The photovoltaic devices' p-n junction would then be found in the bulk region. The photovoltaic devices would commonly comprise silicon.

Figure 5:
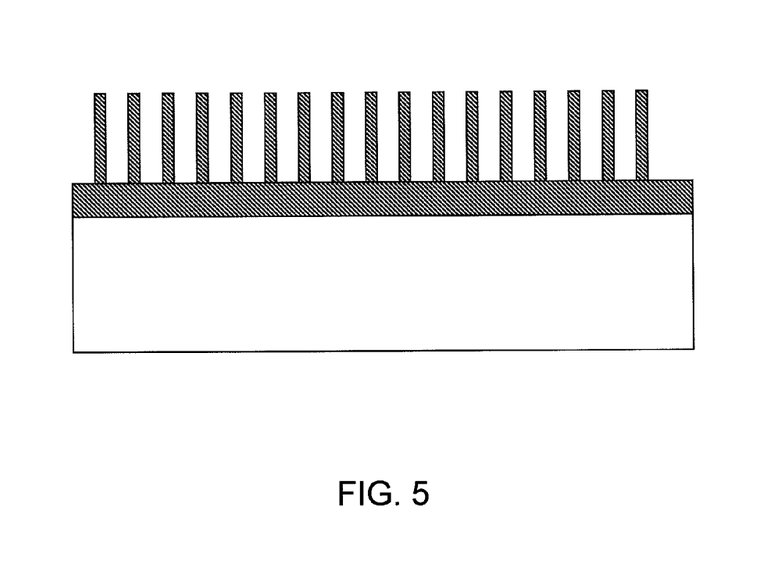
FIG. 5 schematically depicts a solar cell with nanowires where the p-n junction lies within the bulk region.

In an aspect of this invention, a nanowire based solar cell is provided where the nanowires do not extend all the way to the junction. Instead, the junction is in the bulk region and the nanowires are part of the top part of the junction, as depicted schematically in FIG. 5.

In a further aspect of the invention, a process is provided for manufacturing solar cells comprising nanowire arrays in which there is a p-n junction in the bulk of the solar cell and the nanowires are part of the emitter.

Solar cells of the invention may be designed to make use of the suppression of photocarrier recombination relative to a nanowire solar cell where the nanowires overlap with the depletion region. Nanowires also have a suppressed free carrier optical absorption which decreases the reflection in the nanowires over bulk material. The recombination of carriers in our solar cell design may be, for example, about $10^2$, about $10^3$, or about $10^4$ less relative to solar cell designs where the nanowires contain or overlap with the depletion region.

In order to benefit from the absorption of light inside the nanowires, the nanowires are desirably short enough to allow electron and holes created by the light to diffuse through the quasi-neutral region and go into the depletion region. To avoid significant recombination in the nanowires, the nanowires may be placed outside the depletion region. Thus, in order to achieve effective free carrier transport to the junction without causing increased recombination, the nanowire array base should be just outside of the depletion region.

Figure 6:
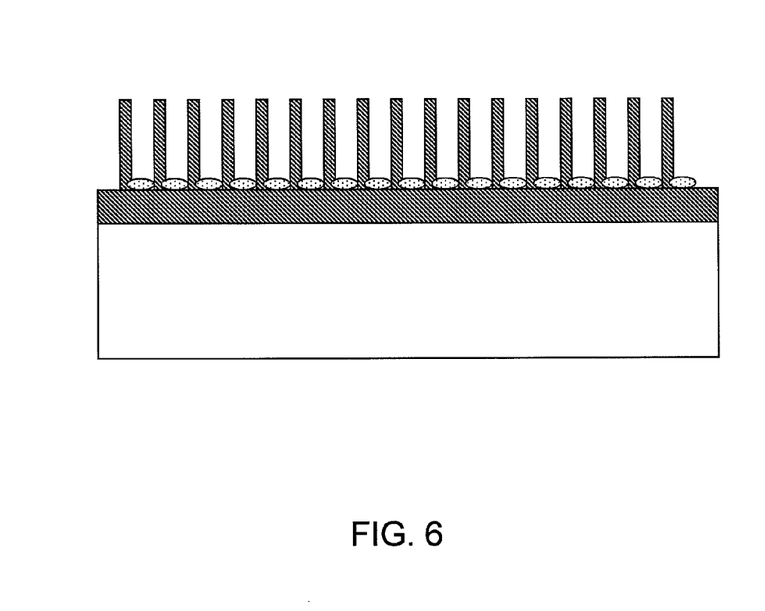
FIG. 6 schematically depicts a solar cell with nanowires where metal particles are found where the nanowires meet the bulk region.

Furthermore, in a process of the invention, self-aligned metal nanoparticles or films may be produced at the bottom of the nanowire array, as schematically depicted in FIG. 6. Hence if the nanowire array is placed right outside the junction, then the metal will be in a good location for plasmonic photovoltaic enhancement.

Plasmonic photovoltaic enhancement is a proposal which is expected to increase the light absorption of a solar cell. The surface plasmons of metal particles or thin films placed near a solar cell junction enhance absorption of light near each particle or thin film and hence increase the efficiency of the solar cell, as discussed in reference (5) below. In detail, incident light is absorbed by the metal nanoparticles or thin film, which transfer energy into the semiconductor by surface plasmon polaritons. An electron and a hole are then created inside the semiconductor via the surface plasmon polaritons. Surface plasmon polaritons can transfer energy to the silicon through a range of around 100 nm. This method has been the subject of calculations relating to crystalline silicon solar cells and tested with dye-sensitized thin films. (See references (13) and (14) below.)

Figure 7:
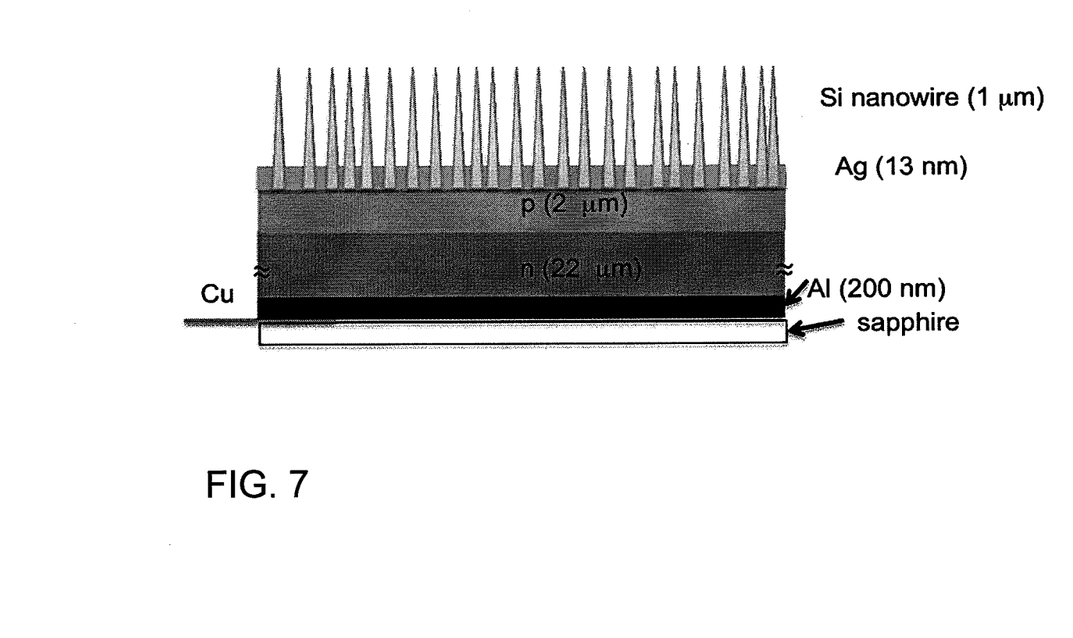
FIG. 7 schematically depicts with possible dimensions a silicon nanowire photovoltaic cell with a submerged contact.

In addition, the metal at the bottom of the nanowire array (FIGS. 6-7) can be used as a contact for the device. This would provide a "submerged" contact that directly contacts the full device yet does not significantly block light from being converted into electricity. Suppose the nanowires to be p-type as in FIG. 7. Light is incident onto the cell and partly absorbed in the nanowires, resulting in electron-hole pairs. The minority carrier electrons in the nanowires then diffuse to the depletion region and find their way to the backside contact. Some of the light may still be absorbed in the bulk (not nanostructured) p-type region as well as the n-type region, also contributing to current. Photons absorbed in the n-type region also create electron-hole pairs. For these pairs, the minority carrier holes diffuse to the depletion region and drift through this region, exiting it by passing to the p-type silicon. The carriers then diffuse to the submerged contact to produce current. This design allows the light absorption to occur over the full top surface, allows carriers to move to the contacts, and gives a very low contact resistance.

Conventional, non-submerged contacts in photovoltaic devices have the disadvantage that they block some of the light coming from above. The submerged contacts allow this light to pass first through the nanowire array, whose wire diameter may be for example no more than about 50 nm in diameter, no more than about 75 nm in diameter, no more than about 100 nm in diameter, or no more than about 200 nm in diameter, before the light strikes the contact. In addition, light reflected from the submerged contacts in a roughly upward direction is likely to strike a nanowire, potentially giving it a further opportunity to create an electron-hole pair.

In devices of the invention, the nanowire array may have, for example, a height between about 0.05 μm and about 6 μm, or between about 0.1 μm and about 2.5 μm, or between about 0.5 µm and about 2 µm, or between about 1 µm and about 1.5 µm, as measured from the substrate. Where the nanowire array is etched out of a substrate, the substrate may have a thickness before etching which is highly variable, since it may be, for example, a commercially available silicon wafer or it may be a substrate grown or deposited on a different substrate. Thus the substrate from which the nanowires are etched may be as thick as about 1 mm, or 800 µm, or 500 µm, down to about 10 µm, about 6 µm, or about 3 µm.

While the nanowires of the devices of the invention might have a constant diameter along their length, alternatively they might also have a modest taper. Desirable taper angles might be, for example, no more than about 0.5 degrees, about 1 degree, about 2 degrees, or about 4 degrees, or in a range between about 0.5 degrees and about 1 degree, about 2 degrees, or about 4 degrees.

The nanowires may be exactly or approximately perpendicular to their substrate. The nanowires' deviation from perpendicularity might, for example, be no more than about 0.5 degrees, about 1 degree, about 2 degrees, or about 4 degrees, or in a range between about 0.5 degrees and about 1 degree, about 2 degrees, or about 4 degrees. Greater deviations from perpendicularity are however also possible.

Junction depth of the devices of the invention may have a fairly wide variation. Measured from the bottom of the nanowires after they are fabricated, it may range from about 30 nm to about 3 µm, from 300 nm to about 2 µm, or about 1 µm to about 1.5 µm. Those of skill in the art will understand that the junction depth may be controlled by the choice of processing conditions with diffusion or ion implantation, for example as discussed in Franssila, reference (20), chapters 14 and 15. Typical processing conditions used for junction depth control would be, for example, the energy of the implanted ions and the duration and temperature of a drive-in period for the dopants.

A wide variety of dopants are known in the art, for example P, As, B, Sb, Al, Ga, Cu, In, Au, Fe, or Zn. In the devices of the invention, the dopants are present at levels chosen as described in the Background to achieve adequate conductivity without unduly raising recombination and free carrier absorption, so that the photoexcited carriers exit the nanowire array and enter into the depletion region before recombining. Dopant maximum concentrations may be for example between about $10^{15}$ cm$^{-3}$ and $10^{18}$ cm$^{-3}$, or between about $3\times10^{16}$ cm$^{-3}$ and about $3\times10^{17}$ cm$^{-3}$.

A figure of merit affected by the dopant concentration is the diffusion length of the majority and minority carriers. As noted, this diffusion length is strongly affected by the dopant concentration. In nanowire solar cells of the invention the minority carrier diffusion length is desirably greater than the nanowire length. It may be for example at least about 0.5 µm, at least about 1 µm, at least about 2 µm, at least about 4 µm, at least about 6 µm, at least about 10 µm, or at least about 25 µm.

The metal layer in the devices of the invention may have a variety of thicknesses. It may lie, for example, between about 10 and about 80 nm, or between about 20 and about 60 nm, or between about 30 and about 50 nm.

A nanowire array with a submerged contact has potential uses beyond photovoltaic cells. For example, a light emitting diode could be envisioned having the same general structure. The back contact and submerged contact would be used to drive a current which would generate photons.

Furthermore, it would be possible to create nanostructures which have forms other than nanowires with processes like those described here. This could be done, for example, by not using nanoparticles underneath the silver or other metal, but rather patterning the silver by some known means (e.g., lithographically) in order to form nanostructures of other forms (e.g., which have elongated cross-sections in a plane parallel to a surface of the bulk region). The idea of a submerged contact could also be implemented in a similar way with other nanostructuring in place of a nanowire array.

B. Exemplary Process

An exemplary process for making a solar cell of the invention would be as follows:

1) Start with undoped or lightly doped p-type <100> silicon.

2) Clean the wafer. It is desirable that the substrate surface is clean and free of moisture in order to achieve good adhesion between the metal film and the silicon. One acceptable clean is a three step clean. First the substrates are cleaned in solvents using baths of acetone, methanol, IPA, and DI water inside an UltraSonic cleaner. Then the substrate is dried. Lastly, the residual organic materials are cleaned off using a plasma etch where the plasma is oxygen, argon or another suitable type of plasma. BOE (buffered oxide etch) is subsequently used to remove any native oxide formed on the surface.

3) Place nanoparticles (e.g., iron oxide, silica) on the wafer surface. (Further details on one way to do this are provided in the alternative process below.) A continuous layer of silver (e.g., 40 nm) is deposited using physical vapor deposition such as sputtering on top of the substrate to cover both the bare silicon regions and the nanoparticles. It is also useful to Ar clean the surface in-situ prior to metal deposition in order to remove any oxide that might have reformed between BOE and pumping down the chamber.

4) Place the silver coated silicon wafer inside the etch solution. The substrate is subsequently submerged into an aqueous solution made up of 4-49 weight percent HF and 0.5-30 weight percent $H_2O_2$. Although the mechanism for enhanced etching of silicon is unknown, what is known is that the $H_2O_2$ will degrade the Ag, forming holes in the silver. Furthermore, where the Ag is in contact with the silicon, the $H_2O_2$ oxidizes the silicon, and the HF etches this oxide. Thus where the Ag contacts the silicon the etch rate is enhanced. Thus, the silicon will etch everywhere except for where the silver has a hole and at this location a nanowire will form as the silicon is etched around it. The etch is timed so that the nanowires are etched down to the junction, but not through it.

5) Remove, rinse with DI, and dry

6) Implant dopants. N-type dose $4.6\times10^{14}$, 34 keV, 7° tilt.

7) Drive in dopants to activate them, for example by a 30 minute 1000° C. anneal.

8) Evaporate 30 nm of gold onto a glass slide

9) Press gold coated glass onto nanowire side of silicon

An alternative approach for making contacts to the nanowire side of the cells would be to use other known methods of contacting solar cells. For example, one could instead of steps 8) and 9) above employ step 8b) Screen print metal electrodes on the wafers.

In the above process it would also be possible to use alternatives to $H_2O_2$ as described for example in reference (18). That reference also provides additional information about how to perform the process described above. One alternative oxidizer is oxygen, which may be introduced by bubbling oxygen through the HF. Other oxidizers include: ozone, chlorine, iodine, ammonium perchlorate, ammonium permanganate, barium peroxide, bromine, calcium chlorate, calcium hypochlorite, chlorine trifluoride, chromic acid, chromium trioxide (chromic anhydride), peroxides such as hydrogen peroxide, magnesium peroxide, dibenzoyl peroxide and sodium peroxide, dinitrogen trioxide, fluorine, perchloric acid, potassium bromate, potassium chlorate, potassium peroxide, propyl nitrate, sodium chlorate, sodium chlorite, and sodium perchlorate.

C. Alternative Process

A process for making photovoltaic cells with submerged contacts could include the following steps.

1) Select a silicon-on-insulator wafer with a 4 micron, low doped, p-type device layer and a buried oxide layer. The thickness of the buried oxide layer is of little consequence; however, greater than 500 nm is preferred for this process. Remove all organic and metallic contamination by an RCA clean.

2) Etch the wafer for 5-10 minutes in 1 part $NH_4OH$: 1 part $H_2O_2$: 5 parts $H_2O$ (DI) heated to 80° C. Dunk the wafer in a 5 wt % HF solution for 2 minutes to remove any oxide layer that may have potentially formed as a result of previous steps.

3) Etch the wafer for 5-10 minutes in 1 part HCl: 1 part $H_2O_2$: 5 parts $H_2O$ (DI) heated to 80° C. Dunk the wafer in a 5 wt % HF solution for 2 minutes to remove any oxide layer that may have potentially formed. Rinse the wafer with DI for 3 minutes to remove any residual acids in a dump tank.

4) In order to dope the top layer n-type, deposit spin-on-dopant (Product: Honeywell P854 2:1 Phosphorus) by first spinning at 200 RPM for 2 sec, followed by a ramp to 3000 RPM for 20 sec. There is no need to bake the samples on a hotplate once the SOD has been deposited as would normally be done with photoresist since adequate baking will occur during the drive-in step which follows.

5) Drive-in. A Lindberg Blue, 3-zone, quartz tube furnace rated to 1100° C. is used for drive-in and activation of the dopant. Ramp the furnace up to 850° C. and hold while flowing $N_2$ gas at 4 L/min and $O_2$ gas at 500 SCCM. Once the temperature and gas flow is stable, push the wafer/wafers into the furnace and begin ramping up to the desired drive in temperature which can typically range from 900° C.-1100° C. The ramp up speed should be controlled to 6° C./min. Hold at the high temperature for 30 minutes and ramp back down to 850° C. at a controlled rate of 3° C./min. Once 850° C. has been reached, the wafers can be removed from the furnace and allowed to cool naturally. The glassy layer left by the SOD is removed by etching in 10 wt % HF for 5 minutes.

Figure 8:
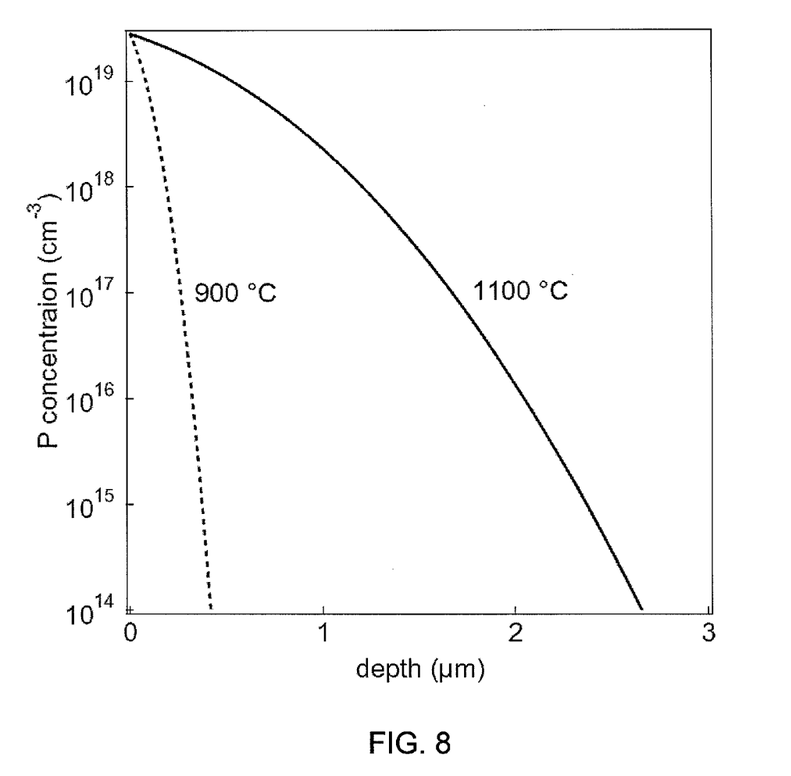
FIG. 8 depicts the dopant profiles expected to result from the diffusion drive-in process recited below.

This diffusion doping process would result, depending on the drive-in temperature, in doping profiles like those shown in FIG. 8. When doping into a low doped p-type layer of $10^{16}$ $cm^{-3}$, the resulting junction depth would lie between 320 nm and 2 μm.

6) Next, deposit aluminum on the device layer via sputtering. Protect the edges of the samples with kapton tape to prevent Al from depositing on the sides of the device and making a short. An Argon in-situ pre-clean of the surface is done at 25 mTorr and 12 W to remove any native oxide that may have formed after the HF etch and before inserting the substrates into the sputtering tool. Deposit 2000 Å of aluminum at 250 W and 4 mTorr.

8) Remove the samples, and bond a copper lead wire to the surface of the Al using silver paint. Bond the entire structure face down to a clean sapphire wafer using Allied High Tech Products part number 71-10000 two part epoxy bond 110 at a ratio of 7:1 (partA: partB). The sapphire is used to act as a chemically inert support for the thin silicon as it continues through the rest of the process. Cure the epoxy resin in a box furnace at 150° C. for one hour until the color is a deep red.

9) Flip the samples over so that the handle portion of the SOI wafer is now the top. Use an STS MPX/LPX RIE to etch off the entire handle layer using an $SF_6/C_4F_8$ Bosch chemistry. First, protect the edges of the wafer with kapton tape to ensure no undercutting occurs of the device layer. The recipe starts with $SF_6$ etch step (136 sccm, Pcoil=600 W, Pplaten=12 W for 14.8 sec.) and cycles to a $C_4F_8$ passivation step (90 sccm, Pcoil=600 W, Pplaten=2 W, for 7 sec.) until the wafer is nearly through to the buried oxide layer.

10) Once the buried oxide layer is reached, the passivation step is turned off and only the etch step is allowed to continue until all the handle silicon is removed, but desirably continues for at least 5 minutes regardless. This is done to remove any $C_4F_8$ passivation that may be coating the surface after etching.

11) Once the handle layer is gone, the samples are removed from the RIE chamber and etched in 7:1 BOE to get rid of the buried oxide layer. Typical etch rates are approximately 2 microns per hour, however this time can fluctuate depending on oxide quality. Visual inspection can be used along with ellipsometry to ensure that no oxide remains.

12) Place the chip into a Piranha solution made up of 3 parts 96% $H_2SO_4$ and 1 part 30 wt % $H_2O_2$ for 2 minutes in order to create a hydrophilic surface. Make sure that the underlying epoxy resin is not excessively etched by piranha solution or else the thin silicon layer can be completely undercut from the sapphire substrate. Remove the substrate from the bath and place it into a dump dank of flowing DI water to remove any residual acids. Blow it dry with nitrogen gas.

13) Make a colloidal suspension of 10 nm oleic acid functionalized iron oxide nanoparticles in chloroform by diluting product #SOR-10-0050 from OceanNanotech to a concentration of 1 mg/mL. Coat the silicon wafer with the iron oxide by dipping the silicon into the colloidal suspension and then removing the substrate so that the surface normal is perpendicular to the vertical direction of motion allowing the chloroform to sheet off the surface. A portion of the surface may be left uncoated for ease in making contact subsequently. The combination of the hydrophilic surface and the nature of the oleic acid functionalized iron oxide nanoparticles, results in a natural self-assembly that limits agglomeration and gives some reasonable spacing to the particles. Then bake the sample on an 80° C. hot plate for 2 minutes and clean it with an in-situ $O_2$ plasma prior to metal deposition.

In addition to iron oxide nanoparticles, 100 nm polystyrene spheres have also been used successfully in this process. In this situation, a hydrophilic surface is created on the silicon substrate as described above. The polystyrene spheres (purchased from Duke Scientific Corporation) are diluted to a concentration of 1% and spun onto the substrate at 500 RPM for 5 seconds followed by a ramp to 2000 RPM for 40 seconds. The polystyrene spheres create a single monolayer on the surface.

14) Sputter silver (Ag) or silver alloy onto the wafer. Other physical vapor deposition techniques can be used including a thermal evaporator or e-beam evaporator. A continuous film is desired with no breaks or cracks that would cause a portion of the film to become isolated from the remainder.

The Ag alloy can be a multicomponent alloy, not limited to a binary system, made up of a variety of constituents (for example, Pt, Si). A portion of the constituents can be of known silicon dopants and types (for example, B, P, As, Sb, Al). The dopants can be, for example, less than 1% of the total alloy weight, or less than 0.1% of the total alloy weight.

The submerged Ag or Ag alloy contact can be heated to a temperature between 25 C-900 C for a suitable length of time from 0 to 4 hrs in order to drive alloy constituents or dopants into the silicon to form a selective emitter. The selective emitter will tend to be confined to the areas between the nanowires where the submerged contact exists. Prior to heating, $Al_2O_3$ deposited using ALD (atomic layer deposition), or other materials from other processes, can be deposited to coat the submerged contact in order to lower the wetting angle of the submerged contact to keep the metal film intact and prevent it from beading up.

15) Etch the resulting silver-coated substrate with an aqueous HF solution to form nanowires. In more detail, once the chip is coated with the appropriate film of Ag, season the aqueous HF solution before commencing the etching reaction by flowing $O_2$ gas into the bath to create a vigorous bubbling for a period of 10 minutes. Once the bath is seasoned, submerge the samples, e.g., for 30 minutes. This may be expected to achieve an average wire length of 1 micron. At the completion of the etch, remove the samples and put them into a dump-tank of flowing DI water and then blow them dry with $N_2$. At this point, the deposited Ag has etched into the silicon and is now lying at the base of the nanostructure. This silver forms the submerged contact described above.

The concentration of HF can vary from full strength (about 49 wt %) all the way down to very nominal concentrations. Initial observations have shown that the length of the resulting nanostructure increases as HF concentration is reduced. Concentrations as low as 2 wt % and below may be used. For example, a solution of 8 wt % HF may be used. As the HF concentration is altered, the film thickness may need to be varied for best results.

It may be desirable to ensure that the etch duration and vigorousness are balanced so the contact remains continuous at the base of the nanostructure. A considerable degree of discontinuity, however, is tolerable. The submerged contact may have, for example, no more than about $10^3$, about $10^4$ or about $10^5$ breaks per $cm^2$. It may comprise no more than about $10^3$, about $10^4$ or about $10^5$ separate connected components per $cm^2$. In addition, the metal thickness, nanoparticle density, and etch concentrations may be controlled in the process to achieve submerged contacts with desirable properties, including continuity.

16) Electrically contact the silver film, for example in an area where no nanoparticles were placed in step 13).

An experiment has been carried out building a prototype photovoltaic cell according to the processes described above. A measurable photocurrent from absorption of light inside the nanowire array was detected.

The following references are of interest in relation to this application: (1) M. A. Green, Silicon Solar Cells: Advanced Principles and Practice (1995); (2) "Optical Properties of Bismuth Nanowires", M. Black, J. Reppert, M. S. Dresselhaus, A. M. Rao, in Encyclopedia of Nanoscience and Nanotechnology, H. S. Nalwa ed. (2004); (3) Erik C. Garnett, Peidong Yang J. Am. Chem. Soc. 130 (29) (2008) 9224-9225; (4) Brendan M. Kayes, Harry A. Atwater, Nathan S. Lewis, J. of App. Phy. 97 (11) 2005, 114302; (5) U.S. patent application 20070107103, "Apparatus and methods for manipulating light using nanoscale cometal structures", Krzysztof J. Kempa, Michael J. Naughton, Zhifeng Ren, Jakub A. Rybczynski; (6) G. Goncher, R. Solanki, J. R. Carruthers, J. Conley Jr., Y. Ono, J. Electr. Mat. 35 (7) (2006) 1509-1512; (7) B. Kayes, H. Atwater, N. Lewis, Journal of Applied Physics 97 (2005) 114302; (8) U.S. patent application Ser. No. 11/081,967; (9) U.S. Patent application 20070278476; (10) U.S. patent application 20080169017; (11) U.S. patent application 20070289623, Harry A. Atwater, "Plasmonic Photovoltaics"; (12) T. Heidel, J. Mapel, M. Singh, K. Celebi, M. Baldo APL 91 093506 (2007) 093506; (13) M. Kirkengen, J. Bergli, Y. Galperin, J. Appl. Phys. 102 (9) (2007) 093713; (14) C. Hagglund, M. Zach, B. Kasemo, APL 92 (1) 013113 (2008); (15) U.S. Provisional Patent Application Ser. No. 61/195,872, entitled "Process for Structuring Silicon," with inventors Brent Buchine et al., filed Oct. 9, 2008; (16) Handbook of Photovoltaic Science and Engineering (A. Luque & S. Hegedus eds., 2003), (17) U.S. Provisional Patent Application Ser. No. 61/114,896 entitled "Solar cells where a nanowire array makes up part of the n or p type region," filed Nov. 14, 2008; (18) U.S. Provisional Patent Application Ser. No. 61/141,082, entitled "Process for Fabricating Nanowire Arrays," filed Dec. 29, 2008; (19) U.S. Provisional Patent Application Ser. No. 61/142,608, entitled "Process for Structuring Silicon," filed Jan. 5, 2009; (20) Sami Franssila, *Introduction to Microfabrication* (John Wiley & Sons, 2004); (21) *Handbook of Photovoltaic Science and Engineering* (A. Luque & S. Hegedus eds. 2003), particularly chapter 3.

All patents, patent applications, and publications mentioned herein are hereby incorporated by reference in their entireties. However, where a patent, patent application, or publication containing express definitions is incorporated by reference, those express definitions should be understood to apply to the incorporated patent, patent application, or publication in which they are found, and not to the remainder of the text of this application, in particular the claims of this application.

The invention claimed is:

1. A photovoltaic device comprising:
   a crystalline semiconductor substrate comprising:
   a bottom n-doped region;
   a top p-doped region adjacent to and in direct physical contact with the n-doped region, wherein the n-doped region and the p-doped region form a p-n junction within the bulk of the crystalline semiconductor substrate, wherein the p-n junction is located at least about 30 nm from the bottom of the nanowires and the top p-doped region contains p-dopant throughout the entirety of the top p-doped region; and
   a plurality of p-doped nanowires in direct physical contact with the top p-doped region of the crystalline semiconductor substrate.

2. A device as described in claim 1, wherein the nanowires have a mean diameter sufficiently small to suppress free carrier absorption.

3. A device as described in claim 1, wherein the nanowires are no more than about 200 nm in diameter.

4. A device as described in claim 1, wherein the n-doped region and the p-doped region comprise silicon.

5. A device as described in claim 1, wherein the majority of nanowires are approximately perpendicular to a crystal plane in an orientation other than <100>.

6. A device as described in claim 1, wherein the p-n junction is located at least about 1 μm below the base of the nanowires.

7. A device as described in claim 1, wherein the p-n junction is located at least about 0.75 μm below the base of the nanowires.

8. A device as described in claim 1, further comprising metal particles in the vicinity of the area where the p-doped nanowires are in direct physical contact with the p-doped region.

9. A device as described in claim 1, wherein the device is fabricated using a process comprising metal enhanced etching in a solution comprising HF and an oxidizer.

10. A device as described in claim 1, wherein the p-n junction is located at least about 300 nm from the bottom of the nanowires.

11. A device as described in claim 1, wherein the p-n junction is located at least about 300 nm from the bottom of all the nanowires.

12. A device as described in claim 1, wherein the p-doped region comprises no more than about $10^{18}$ dopants per cubic centimeter.

13. A device as described in claim 1, wherein the crystalline semiconductor comprises polycrystalline silicon.

14. A device as described in claim 1, wherein the p-doped nanowires are at an angle different from 90 degrees to a surface where they have direct physical contact with the p-doped region.

15. A photovoltaic device comprising:
a crystalline semiconductor substrate comprising:
a bottom p-doped region;
a top n-doped region adjacent to and in direct physical contact with the p-doped region, wherein the p-doped region and the n-doped region form a p-n junction within the bulk of the crystalline semiconductor substrate, wherein the p-n junction is located at least about 30 nm from the bottom of the nanowires and the top n-doped region contains n-dopant throughout the entirety of the top n-doped region; and
a plurality of n-doped nanowires in direct physical contact with the top n-doped region of the crystalline semiconductor substrate.

16. A device as described in claim 15, wherein the nanowires have a mean diameter sufficiently small to suppress free carrier absorption.

17. A device as described in claim 15, wherein the nanowires are no more than about 200 nm in diameter.

18. A device as described in claim 15, wherein the n-doped region and the p-doped region comprise silicon.

19. A device as described in claim 15, wherein the majority of nanowires are approximately perpendicular to a crystal plane in an orientation other than <100>.

20. A device as described in claim 15, wherein the p-n junction is located at least about 1 μm below the base of the nanowires.

21. A device as described in claim 15, wherein the p-n junction is located at least about 0.75 μm below the base of the nanowires.

22. A device as described in claim 15, further comprising metal particles in the vicinity of the area where the n-doped nanowires are in direct physical contact with the n-doped region.

23. A device as described in claim 15, wherein the device is fabricated using a process comprising metal enhanced etching in a solution comprising HF and an oxidizer.

24. A device as described in claim 15, wherein the p-n junction is located at least about 300 nm from the bottom of the nanowires.

25. A device as described in claim 15, wherein the p-n junction is located at least about 300 nm from the bottom of all the nanowires.

26. A device as described in claim 15, wherein the n-doped region comprises no more than about $10^{18}$ dopants per cubic centimeter.

27. A device as described in claim 15, wherein the crystalline semiconductor comprises polycrystalline silicon.

28. A device as described in claim 15, wherein the p-doped nanowires are at an angle different from 90 degrees to a surface where they have direct physical contact with the p-doped region.

* * * * *